United States Patent
Ishaug et al.

(10) Patent No.: US 6,652,707 B2
(45) Date of Patent: Nov. 25, 2003

(54) METHOD AND APPARATUS FOR DEMOUNTING WORKPIECES FROM ADHESIVE FILM

(75) Inventors: Brian Ishaug, Houston, TX (US); Chung-Yung Wang, Sugar Land, TX (US); Hung-Lun Chang, Missouri City, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 30 days.

(21) Appl. No.: 10/134,891

(22) Filed: Apr. 29, 2002

(65) Prior Publication Data

US 2003/0201066 A1 Oct. 30, 2003

(51) Int. Cl.[7] .............................................. B32B 35/00
(52) U.S. Cl. ........................ 156/344; 156/253; 156/268; 156/584; 438/464; 438/976
(58) Field of Search ................................. 156/344, 584, 156/253, 268; 438/464, 976, FOR 386; 29/426.1, 426.3, 426.4, 426.5, 426.6

(56) References Cited

U.S. PATENT DOCUMENTS 3,681,178 A * 8/1972 Margulies ................... 156/584

| 4,472,218 | A | 9/1984 | Avedissian et al. |
| 4,664,739 | A | 5/1987 | Aurichio |
| 4,921,564 | A | 5/1990 | Moore |
| 6,277,234 | B1 | 8/2001 | Freund et al. |
| 6,290,805 | B1 | 9/2001 | Freund et al. |
| 6,461,942 | B2 * | 10/2002 | Watanabe et al. ........... 438/464 |

* cited by examiner

*Primary Examiner*—Mark A. Osele
(74) *Attorney, Agent, or Firm*—N. Stephan Kinsella (57) ABSTRACT

Demounting workpieces attached to an adhesive surface of an adhesive film with a workpiece demounting apparatus having a base and a plurality of substantially parallel blades mounted to the base. Each of the blades has a substantially linear blade edge, each blade edge lying within a blade-edge plane that is substantially perpendicular to the blades. The spacing between the blades is small enough to support said workpieces and large enough to permit the adhesive film to pass between the blades after being cut by said blade edges during a workpiece demounting operation. The plurality of blade edges thus provides a substantially planar blade-edge surface, in the blade-edge plane, for cutting the adhesive film and for supporting the workpieces while the adhesive film is pulled free from said workpieces.

16 Claims, 9 Drawing Sheets

METHOD AND APPARATUS FOR DEMOUNTING WORKPIECES FROM ADHESIVE FILM

BACKGROUND OF THE INVENTION

1. Field of the Invention

This invention relates generally to methods and apparatuses for demounting workpieces from adhesive film and, in particular, for demounting semiconductor wafer-fabricated chips or dies such as circuit chips, laser chips, and laser bars from adhesive film, after separation operations such as dicing, sawing, or scribing and breaking, without damaging the workpieces.

2. Description of the Related Art

The following descriptions and examples are not admitted to be prior art by virtue of their inclusion within this section.

The manufacture of miniature semiconductor, optoelectronic, and other electronic devices typically involves forming a number of devices on a semiconductor wafer. The semiconductor wafers are typically 2 to 8" in diameter and approximately 0.010" to 0.020" thick. The wafer contains a grid, array, or other layout of devices, which are to be separated into discrete chips or dies. These devices can include integrated circuits such as microprocessors or other circuits consisting of networks of smaller devices such as resistors, transistors, diodes and other electrical circuit elements; or optoelectronic devices, such as semiconductor lasers or photodetectors. Electronic and IC semiconductor chips are typically flat and rectangular (typically square), ranging from about 1 mm to about 10 mm square and from about 0.4 mm to about 0.8 mm in thickness. Optoelectronic devices, such as laser chips, may be less than 0.25 mn along a side (width) and less than about 0.1 mm in thickness (height). Bare die are very fragile and some, such as laser chips, are also very brittle. Laser chips may include long, fragile laser bars, each of which may be separated into a number of edge-emitting lasers at a later stage of processing. Laser bars, for example, may be about 15 mm long, with a rectangular cross-section (about 0.3 mm wide and 0.1 mm in height). These various objects, devices, die, dice, articles, and IC chips may be referred to herein generally as workpieces.

In order to perform various processing tasks on the wafer, such as dicing, scribing and breaking, or sawing the wafer to separate the individual workpieces, the wafer is often mounted on an adhesive film, sometimes referred to as wafer handling tape or film, sticky sheet, polymer support film, adhesive web, wafer tape, tacky tape-adhesive tape, and the like, and generally referred to herein as adhesive film. Adhesive film comprises a carrier layer or carrier film coated on one side with adhesive. Mounting the wafer to adhesive film helps to hold the wafer in place during the dicing operation and to hold the separated workpieces (chips) in place after dicing is complete.

The adhesive film can be affixed to a film support frame, such as an annular retaining ring hoop frame, either by hand or with a wafer film frame mounting device. The support frame may be mounted in an expanding device to expand (stretch) the adhesive film, before the wafer is mounted to the adhesive film and/or after the wafer is diced into discrete workpieces. During and after processing (such as dicing, sawing, scribing and breaking, fracturing, expanding, and the like), tension is maintained on the adhesive film with the annular retainer ring. The support (e.g., hoop) frame may comprise, e.g., concentric inner and outer hoops, which are clamped to the adhesive film. A hoop frame may consist of stainless steel, plastic, or other suitably strong and rigid material. The hoop frame may have a diameter from 5 to 8", for example, so that the size of the supported adhesive film surface is sufficient to mount a wafer. The hoop frame and adhesive film together provide a wafer frame onto which a wafer may be mounted.

After separation of the workpieces from each other, the workpieces need to be removed from the adhesive film without damage to the workpieces. For laser bar workpieces, a wafer expanding device is often used to separate the workpieces further from each other. After separation and expansion, there may be, for example, 30 to 40 laser bars mounted to a given piece of adhesive film, separated from each other by about 0.1 to 0.2 mm. The workpieces are then manually removed from the expanded film through the use of tweezers, vacuum pencils, vacuum collets, or vacuum tips, sometimes in combination with ejector needles, pistons, probes, or protruding bumps or rollers, or through the use of devices such as de-mounters, automatic pick and place machines, and die ejector systems. For example, with a pick and place system, a video screen allows an operator to position the pick up collet over the center of the die, and one or more needles pushes up from the back and dislodges the die from the adhesive film. The vacuum collet then lifts the die from the adhesive film and places it into the carrier (such as a waffle pack or gel pack).

However, because the workpieces are so small and fragile, the manual contact between the workpieces and devices such as tweezers, ejector needles, pins, and rollers can damage the workpieces, e.g. by forming micro-cracks in the device or even breaking the device into separate pieces. This is especially the case with long, thin objects such as laser bars. Thus, it can be time-consuming and difficult to remove such workpieces from adhesive film without damage.

Accordingly, there is a need for improved methods and apparatuses for demounting workpieces from adhesive film and, in particular, for demounting semiconductor wafer-fabricated chips or dies such as circuit chips, laser chips, and laser bars from adhesive film, after separation operations such as dicing, sawing, or scribing and breaking, without damaging the workpieces.

BRIEF DESCRIPTION OF THE DRAWINGS

Other features and advantages of the invention will become apparent upon study of the following description, taken in conjunction with the attached FIGS. 1–10.

DETAILED DESCRIPTION OF THE INVENTION

The present invention provides a method and workpiece demounting apparatus for demounting workpieces from an adhesive film. The workpiece demounting apparatus may be part of a larger workpiece demounting system. A plurality of workpieces are previously adhesively secured to an adhesive side or surface of the adhesive film. The workpiece demounting apparatus of the present invention comprises a plurality of substantially parallel blades mounted to a support means such as a base. Each blade has a substantially linear blade edge. Each blade edge lies within a blade-edge plane, so that the plurality of blade edges provide a substantially planar blade-edge surface also lying in the blade-edge plane. During a workpiece removal operation, the blade-edge surface cuts the adhesive film and simultaneously supports the workpieces while the adhesive film is pulled off the workpieces, thereby separating the adhesive film from the workpieces, i.e. demounting them. In an embodiment, the blade-edge surface may also continue to support the workpieces after removal. In an embodiment, the blade-edge surface is substantially parallel to the bottom of the base. In another embodiment, the blades are mounted in the base surface, which is preferably also parallel to the blade-edge surface. The blades are spaced close enough to support the workpieces, and are preferably substantially evenly spaced from each other. Further details, advantages, and embodiments of the invention are described below with reference to FIGS. 1–10.

Figure 1:
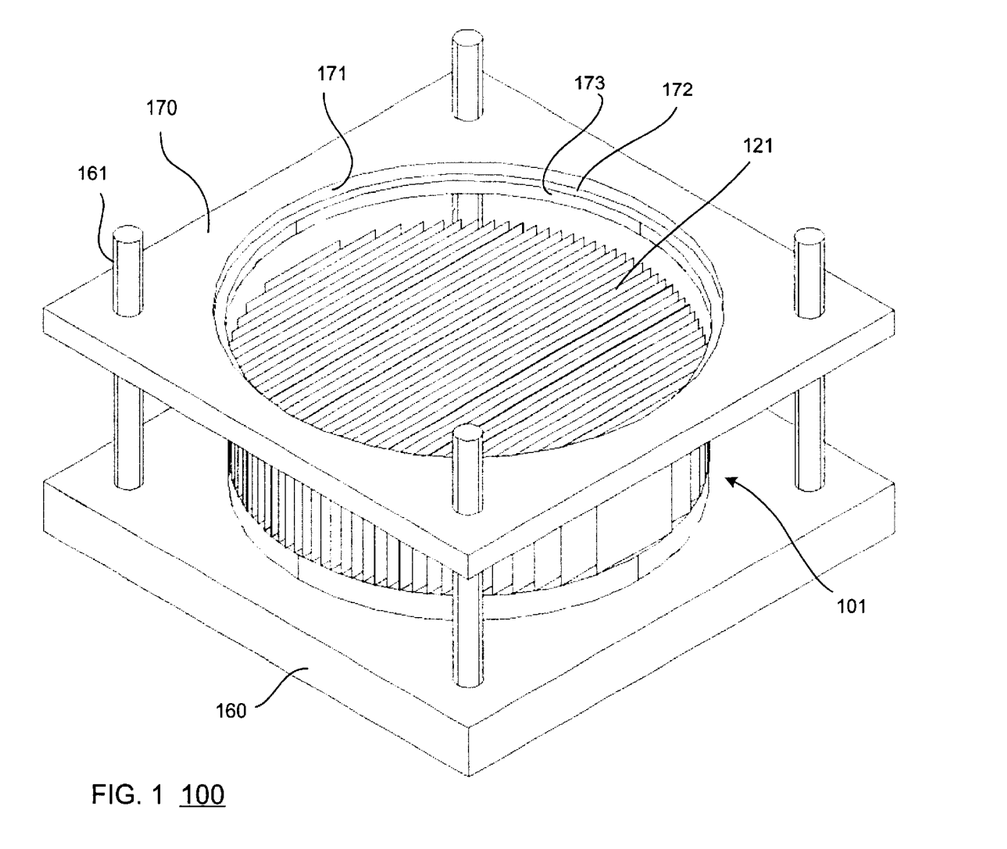
FIG. 1 is a perspective view of a workpiece demounting system for demounting workpieces from adhesive film, the system including a workpiece demounting apparatus, a hoop frame holding member, and linear guides for moving an adhesive film into contact with the blade-edge surface of the workpiece demounting apparatus, in accordance with an embodiment of the present invention.

Referring now to FIG. 1, there is shown a perspective view of a workpiece demounting apparatus or system 100 for demounting workpieces from adhesive film, the system including a workpiece demounting apparatus 101, a hoop frame holding member 170, a guideframe base 160, and guide means such as linear guides 161 for moving an adhesive film into contact and through the blade-edge surface 121 of the workpiece demounting apparatus 101, in accordance with an embodiment of the present invention. The workpieces, hoop frame, and adhesive film are not shown in FIG. 1 but are illustrated in FIGS. 5–8. Workpiece demounting apparatus 101 comprises at least the substantially parallel array of blades 120 and the blade-edge surface 121, and a base for supporting the blades in a fixed position. In various embodiments, the apparatus may comprise other components, such as a cylindrical base 110, and system-level components such as hoop frame holding member 170, guideframe base 160, and guide means such as linear guides 161.

Figure 2:
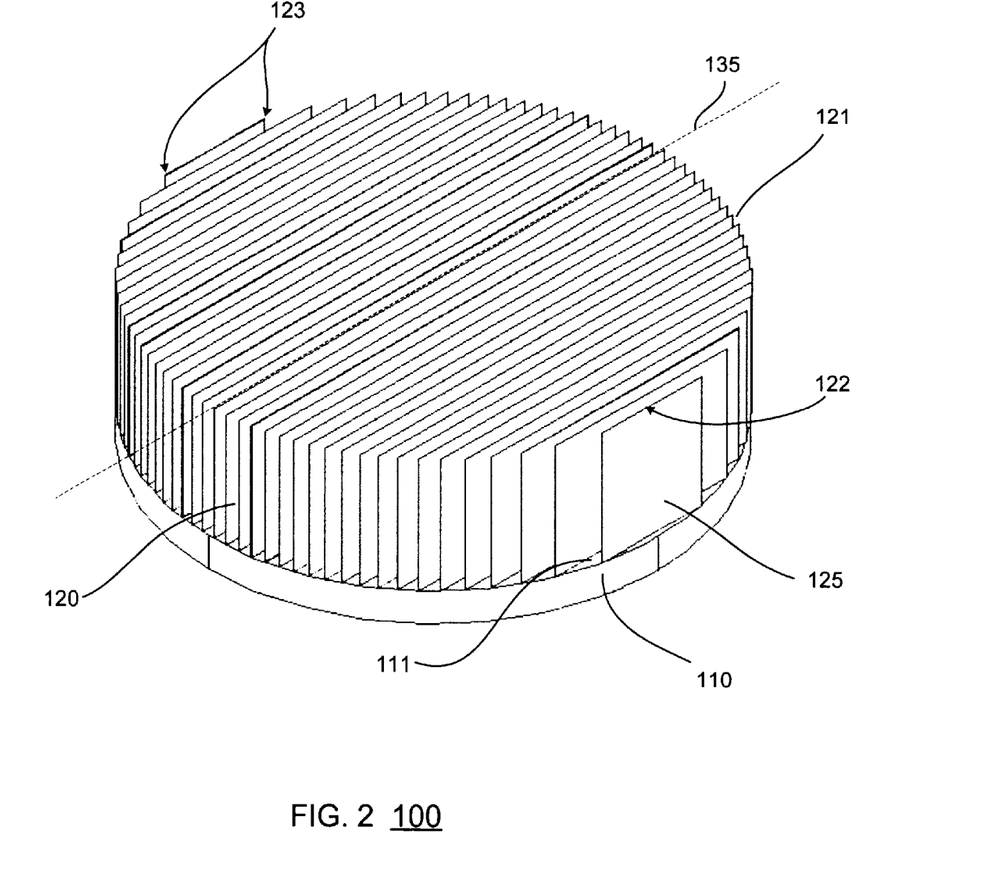
FIG. 2 is a perspective view of the workpiece demounting apparatus, of FIG. 1, in accordance with an embodiment of the present invention.

Referring now to FIG. 2, there is shown a perspective view of the workpiece demounting apparatus 101 of system 100 of FIG. 1, illustrated in further detail and without other components of apparatus 100. In an embodiment, apparatus 101 comprises a base 110, preferably having a substantially planar bottom, so that it may rest upon a flat surface, and a parallel, upper base surface 111 to which a blade array is mounted. Relative and directional designations such as top, bottom, upper, lower, up, and down employed herein are used for ease of illustration, but are not intended to limit the scope of the invention to such orientations.

Base 110 in an embodiment is a substantially cylindrical mounting plate, but may have other shapes in alternative embodiments. A substantially parallel array of blades 120 is mounted to base 110 at a first ("bottom") end of each blade, each blade of blade array 120 being substantially perpendicular to base surface 111. Each of the blades of blade array 120 is substantially thin, flat, planar, and rectangular, and terminates, at a second ("top") end of each blade, in sharp blade edges 122, each blade edge 122 terminating in two corners 123 of the respective blade. Each blade is substantially the same length, so that the linear blade edges 122 all lie within a substantially planar blade-edge surface 121, which lies within the blade-edge plane. Blade-edge surface 121 (and the blade-edge plane) is substantially parallel with base surface 111; blade-edge surface 121 is thus substantially perpendicular to the blades themselves. Accordingly, when base 110 rests (on its bottom surface) on a horizontal surface or support, blade-edge surface 121 is also substantially horizontal (normal to the direction of gravity). The blade-edge surface and base surface are preferably positioned horizontally, so that the workpieces may be supported on the blade-edge surface without rolling off, after removal from the adhesive film.

In alternative embodiments, the base surface 111 may not be planar or parallel to either the bottom surface of base 110 or to blade-edge surface 121. In this case, and in general, the blades of blade array 120 are mounted to the base 110 at their first ends, where the blades are of lengths so that the linear blade edges 122 all lie within a substantially planar blade-edge surface 121, which blade-edge surface is substantially perpendicular to the blades 120. Preferably, the bottom surface of the base 110 is also parallel to the blade-edge surface 121, even if its top surface 111 is not, so that when base 110 rests on a flat, level supporting surface (e.g., a table or ground), then blade-edge surface 121 is also horizontal, so that it is suitable for supporting the workpieces after removal. However, as noted above, base 110 preferably has substantially flat bottom and top surfaces 111, which are parallel to each other and to blade-edge surface 121, and thus perpendicular to blades 120.

In an alternative embodiment, base 110 may have extending support members such as three or more feet or legs, designed to rest upon a surface such as a table or other flat surface. In this case, the bottom surface is not perfectly flat, but nevertheless defines a "support plane"which will be approximately coextensive with the plane of whatever surface on which the base rests. In this case, the base bottom defines a support plane that will be substantially parallel with the blade-edge surface 121 (and blade-edge plane). In this case, the bottom surface is said to be substantially parallel to the blade-edge plane, as in the case of a flat bottom surface.

In alternative embodiments, blades 120 are supported by a support structure, generally designated. as a "base" herein, but not necessarily mounted at the "bottom" ends of the blades in such base. For example, a base (support structure)

may be employed which holds the blades rigidly from one side. In general, the array of blades 120 are supported by a base so that they provide a blade-edge surface 121 which may be employed to remove workpieces from adhesive film.

Blades 120 are fixedly mounted to base 110 by any suitable technique, such as welding, insertion into slots or grooves in the base, or through the use of supporting members, pins and rods, clamps, and the like. Each blade of blade array 120 comprises a strong, substantially flat, thin, rigid piece of stainless steel or other suitable metal, alloy or other material, each blade preferably terminating in a very sharp, linear blade edge 122. In an embodiment, blade array 120 comprises a plurality of razor blades, of a given thickness, material, shape, and size. For example, standard safety razors may be employed. Blade edge surface 121 may be substantially circular with a diameter of about 5 cm (approximately 2 inches), and blade array 120 comprises a plurality of blades, each spaced a certain (preferably substantially uniform) blade spacing distance apart.

As a general matter, the spacing of blade array 120 is preferably determined primarily by the workpiece size. For example, if workpieces have a minimum length X in the direction perpendicular to the blade edges, the blade spacing needs to be close enough to provide at least two blades within a length X. At a minimum, there need to be at least two blades supporting each workpiece during the demounting operation; otherwise, they could be pulled between the blades along with the adhesive film, as the adhesive film is cut and pulled between the blades, or they could fall between the blades after being demounted. In general, the more contact points (i.e., the closer the blade spacing), the better, because this corresponds to a larger and more uniform number of support points per workpiece. This improves the separation process and lowers the likelihood of damage to the workpiece. However, if the blade spacing is too small, it may be difficult to pull the film down through and between the blades, and/or to remove cut film from between the blades after the demounting is completed.

Thus, the blade spacing is preferably as small as possible, and small enough to adequately support demounted workpieces with minimal damage; but not so small that it is difficult to cut or remove the adhesive film, i.e. large enough to permit the adhesive film to pass between the blades.

The blade spacing is preferably substantially uniform, but need not be. In the latter case, the minimum spacing needs to be large enough to permit the adhesive film to be pulled between the adjacent blades with the minimum spacing. The maximum spacing between adjacent blades needs to be small enough to support the workpieces as the adhesive film is cut by the blade edges and pulled beneath the blade-edge surface. In addition, the blades need to be tall enough to provide enough clearance to release the adhesive film from the center die, as shown in FIG. 6F.

For example, IC chips may range from about 1 mm to about 10 mm square, and laser bars may be about 15 mm long and about 0.3 mm wide. For such laser bars, the critical length X is 15 mm, because they can be oriented so that they are perpendicular to the direction of the blade edges. For square workpieces, the critical length X is the length of the longest side. In an embodiment, the blade spacing is sufficient to provide at least three blade edges to support each workpiece. In other embodiments, smaller blade spacing may be employed to provide a larger number of support points per workpiece. Various blade spacings and blade-edge surface sizes may be selected for different applications, as discussed below.

Figure 3:
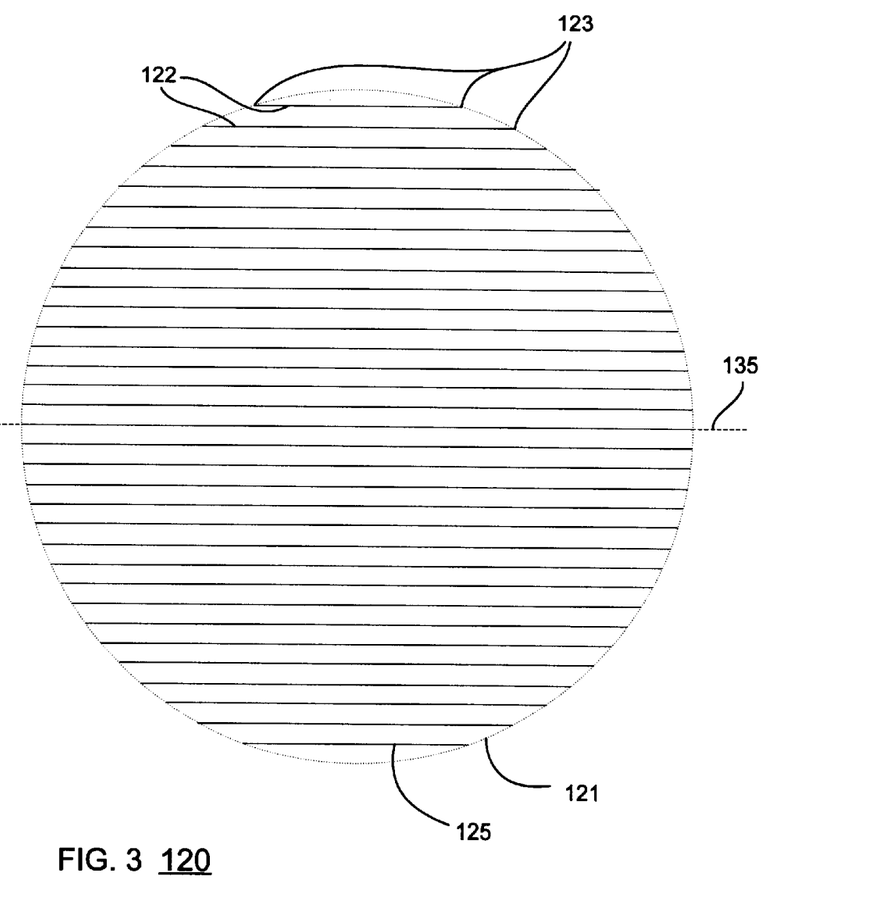
FIG. 3 is a top view of the blade surface of the workpiece demounting apparatus of FIGS. 1–2.

Referring now to FIG. 3, there is shown a top view of the blade-edge surface 121 of blade array 120. As illustrated in FIGS. 1–3, workpiece demounting apparatus 101 has a substantially circular blade-edge surface 121 (i.e., it has a disc-like shape). For example, blade edge surface 121 may be substantially circular with a diameter of about 10 cm (approximately 4 inches), and blade array 120 may comprise about 75 blades, each spaced about 1.33 mm apart. Other blade spacings of the blade array are also possible, as described above. Although a circular blade-edge surface may be preferred for some applications, such as those demounting workpieces that have been diced from a circular wafer, other shaped blade-edge surfaces are possible, such as the elliptical blade-edge surface 921 of alternative blade array 920 of FIG. 9, and the rectangular blade-edge surface 1021 of alternative blade array 1020 of FIG. 10.

Figure 4:
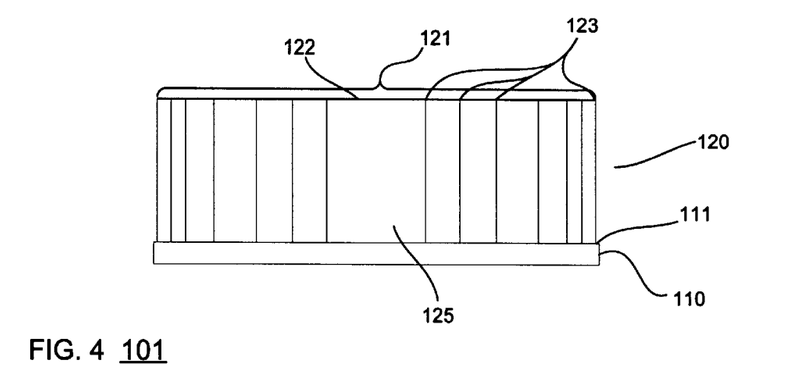
FIG. 4 is a side view of the workpiece demounting apparatus of FIGS. 1–2.
Figure 5:
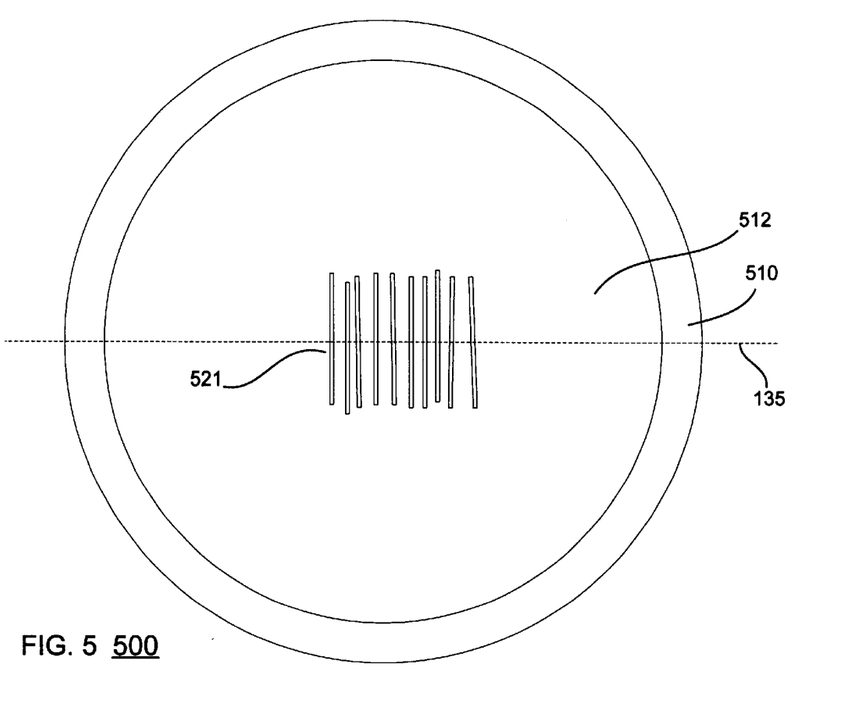
FIG. 5 is a top view of an adhesive film hoop frame and workpieces assembly having substantially rectangular semiconductor laser bar workpieces.

Referring now to FIG. 4, there is shown a side view of the workpiece demounting apparatus 101, from the perspective facing the front blade 125 shown in FIG. 2. Referring now to FIG. 5, there is shown a top view of an adhesive film support frame, hoop frame 510, and workpieces assembly 500 having substantially rectangular semiconductor laser bar workpieces 521 adhesively attached to the adhesive side of an adhesive film 512 mounted to frame 510. Adhesive film such as film 512 consists of a carrier layer or film coated on one side with a suitable adhesive layer. The adhesive film may be characterized as a film having two sides or surfaces, one of which is adhesive (due to the presence of the adhesive layer). Thus, adhesive film is film having one adhesive side or surface, where the other or "back" side or surface is typically nonadhesive (not coated with an adhesive layer).

Adhesive film 512 may be mounted to hoop frame 510 by any suitable technique. For example, a wafer may be placed on the adhesive side of adhesive film 512, before being cleaved into individual chips or die (workpieces), e.g. by dicing or scribing-and-breaking. During this separation process, film 512 may be mounted, in a substantially relaxed state, on a suitable frame or support, such as an annular stretching retaining ring. After the separation of individual die, film 512 may be stretched so that it is taut and. so that each workpiece becomes slightly separated from its neighbor. Film 512 may then be applied to hoop frame 510 in its stretched state. The result is a stretched (taut) adhesive film, mounted to a support frame 510, and having workpieces adhesively disposed on the upper surface of the film. As will be described in further detail below, workpieces mounted on adhesive film 512 may be removed from the adhesive film employing the workpiece demounting apparatus of the present invention.

Referring once more to FIG. 1, system 100 comprises a hoop frame holding member 170 and linear guides 161 for controllably moving the adhesive film (of FIG. 5) into contact with the blade-edge surface 121 of the workpiece demounting apparatus 101, in accordance with an embodiment of the present invention. Workpiece demounting apparatus 101 is affixed at its base 110 to a guideframe base 160, to which are mounted linear guides 161. Hoop frame holding member 170 has an opening for mounting member 170 onto linear guides 161 so that holding member 171 is slideably engaged on the linear guides. The opening is sufficient to secure hoop frame 510 to the mounting member. As shown, the opening may comprise a larger diameter. opening 171 having a diameter about equal to that of the outside diameter of hoop frame 510; and a smaller diameter opening 173 with an inner diameter smaller than that of wall 171 (but larger than that of blade-edge surface 121 so that it may be lowered down past blade-edge surface 121 to demount the workpieces on the adhesive film supported by the hoop frame). A lip or ledge 172 is thus created on which hoop frame 510 can be positioned. Member 170 may include clamps, brackets (not shown) or other means of securing and attaching hoop frame 510 to mounting member 170 when hoop frame 510 sits in opening 171 on ledge 172.

By hand or with other mechanisms such as a lever (not shown), holding member 171, and the adhesive film hoop frame and workpieces assembly may be smoothly and controllably moved directly down onto blade-edge surface 121 of blade array 120 of apparatus 101, as it is guided by linear guides 161.

Figure 6A:
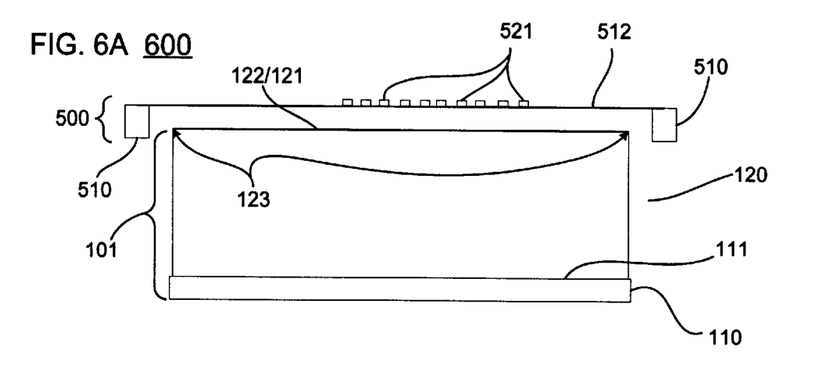
FIGS. 6A–G are cross-sectional side views illustrating the removal of the workpieces from the assembly of FIG. 5 using the workpiece demounting apparatus of FIGS. 1–2, in accordance with an embodiment of the present invention.
Figure 6B:
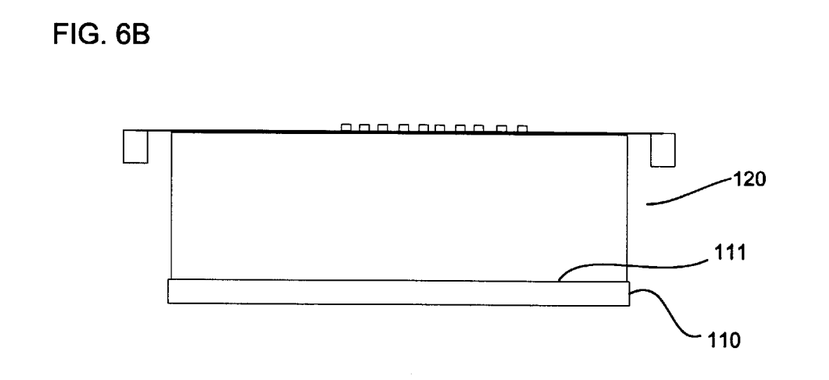
Figure 6C:
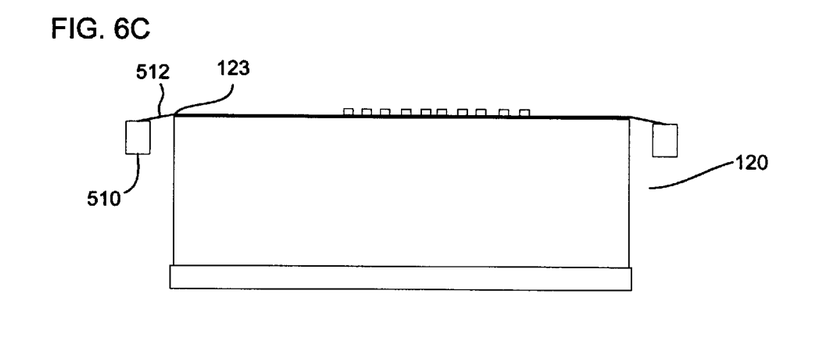
Figure 6D:
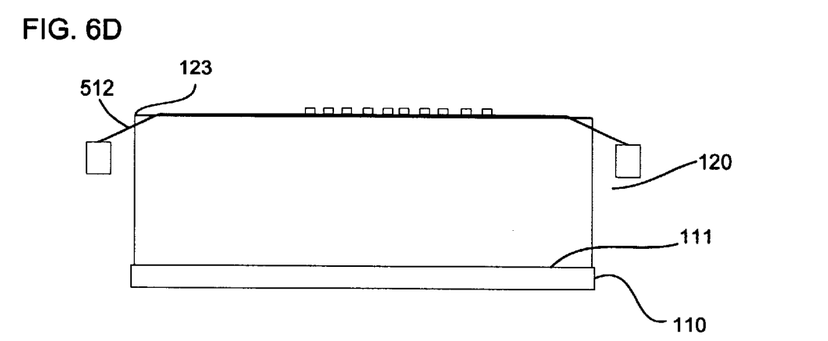
Figure 6E:
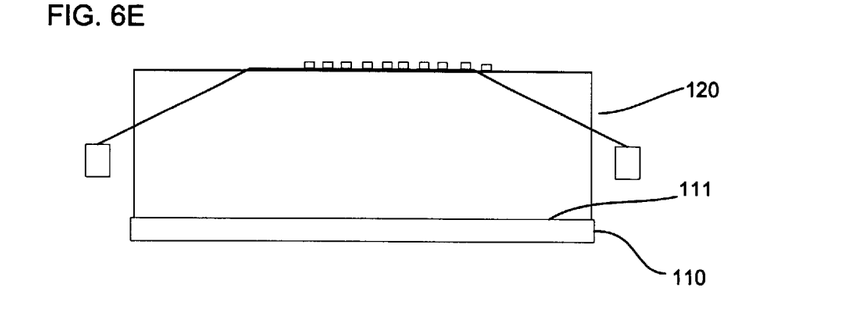
Figure 6F:
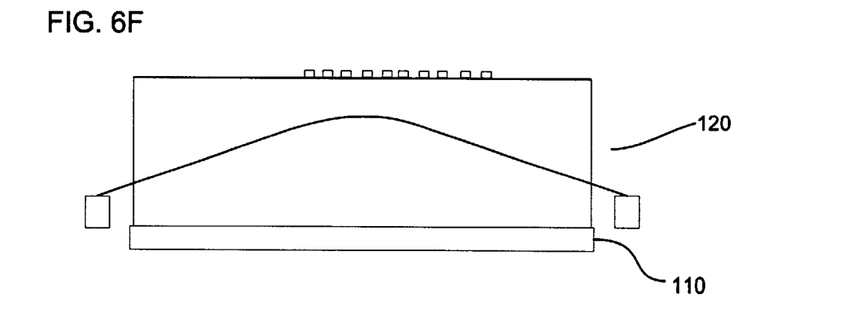

Referring now to FIGS. 6A–G, there are shown cross-sectional side views illustrating the removal 600 of the workpieces 521 from adhesive film 512 of FIG. 5 using the workpiece demounting system 100 of FIG. 1, in accordance with an embodiment of the present invention. In an alternative embodiment, a workpiece demounting apparatus 101 may be used without the other components of system 100, e.g. to remove the workpieces solely by hand. The cross-sectional views of FIGS. 6A–G are taken at the axis denoted by dashed line 135 of FIGS. 1, 3, and 7. As seen in FIG. 6A, assembly 500 is positioned and centered above the top blade-edge surface 121 of apparatus 101, so that workpieces 521 are axially (vertically) above the horizontal blade-edge surface 121 of apparatus 101 and still supported by adhesive film 512. Assembly 500 is oriented so that rectangular workpieces. 521 (which are mounted on film 512 substantially in parallel with one another) are substantially perpendicular to the blade edges 122 of blade-edge surface 121.

Next, as shown in FIG. 6B, assembly 500 is lowered vertically downward until the bottom surface of film 512 just touches the blade edges 122 of blade-edge surface 121. As shown in FIG. 6C, frame 510 continues to be pulled down relative to apparatus 101. At first, film 512 is not cut or torn by blade edges 122 or blade-edge corners 123 (which appear like sharp points to film 512). At a certain point, as shown in FIG. 6D, film 512 begins to be cut, at first by the corners 123 of blade-edges 122. Initially, part of the film has been cut by the outer portion of some or all of the blades 120, but part is still resting atop blade-edge surface 121, because the blade edges 122 have not yet cut through this portion of film 512. At this point, all of workpieces 512 are still supported on and adhesively coupled to a portion of the adhesive surface of film 512, which portion of the film is supported by blade-edge surface 121.

As the frame 510 is pushed even lower relative to blade-edge surface 121, more of film 512 is cut by blade edges 122 and is thus pulled beneath the surface 121, between the blades of blade array 120, as shown in FIG. 6E. At this point, the film has been cut and pulled down beneath the surface of blade-edge surface 121 directly beneath some of the workpieces, thus demounting the workpiece. from the adhesive film, because the workpiece is too large to itself be pulled beneath the edges of blade-edge surface 121. Thus, during the workpiece removal operation, the blade-edge surface cuts the adhesive film and simultaneously supports the workpieces while the adhesive film is pulled free from said workpieces, thereby separating the adhesive film from the workpieces, i.e. demounting them.

After the adhesive film portion formerly contacting a given workpiece is pulled beneath the blade-edge surface 121 and between the blades 120, the now-demounted workpiece continues to be supported on the blade-edge surface.

Figure 6G:
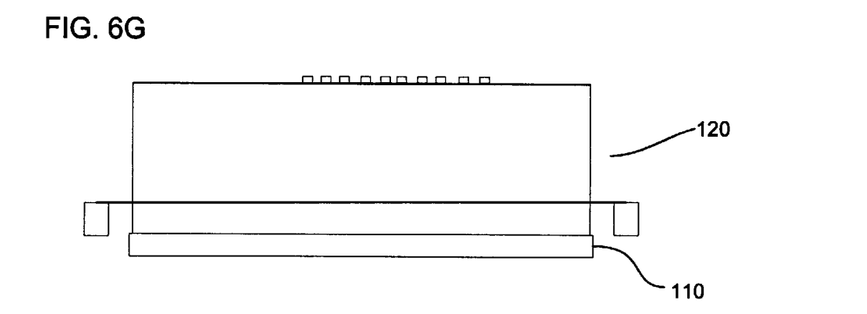

When the frame 510 is pushed far enough down relative to blade-edge surface 121, the all of film 512 formerly in contact with blade edges 122 has been cut and has been pulled beneath the surface 121, between the blades of blade array 120, as shown in FIG. 6F. A further position is shown in FIG. 6G. At this point, all of the workpieces have been demounted from the adhesive film and are supported on blade-edge surface 121.

Alternative methods of forcing the adhesive film through the blade-edge surface may also be employed. For example, additional adhesive film moving members may be utilized to help force the adhesive film down through the blade array. For example, in an embodiment, after step E in FIG. 6 where the film is cut and a portion of it pulled beneath the surface of the blade-edge plane, finger members are inserted from the sides, between the blades but above the cut strips of adhesive film. These fingers are then pushed downward, applying additional downward force to the cut strips of adhesive film to help cut and pull the remaining adhesive film off the backside of the workpieces. Alternatively, additional adhesive film moving members positioned closer to the blade array than the adhesive film frame may be utilized.

In yet another embodiment, only one side of the adhesive film frame is pulled down resulting in workpiece detachment from left to right or right to left depending upon which side is pulled down. In yet another embodiment, the blades are attached only at one side and are open at the bottom. The adhesive film frame is pulled down and under the blades on the side opposite the blade attachment point, whereby the adhesive film frame pivots about a pivot point. Thus, in alternative embodiments, the adhesive film frame need not necessarily remain parallel to the blade-edge surface for the entire demounting process, but may be angled with respect to the blade-edge surface so that one set of blade-edge corners puncture the adhesive film first. In these embodiments and in embodiments in which the adhesive film frame remains substantially parallel to the blade-edge surface during the demounting operation, the adhesive film is forced through the blade-edge surface so that the blade edges cut the adhesive film and support the workpieces while the adhesive film is pulled free from the workpieces.

In the description provided herein, frame 510 is said to be "pulled. down" relative to the blade-edge surface of apparatus 101. As noted above, relative and directional designations such as top, bottom, upper, lower, up, and down are not intended to limit the scope of the invention to such orientations. In like manner, expressions such as "pulled" refer to relative movement of the adhesive film and the blade-edge surface. For example, the workpiece demounting apparatus 101 of the present invention may be employed by "pulling" the adhesive film over the blade-edge surface, or, equivalently, by "pushing" apparatus 101 through hoop frame 510 and thus the adhesive film. Usage of terms such as pulling, pushing, or forcing refer generally to relative movement of the blade-edge surface and adhesive film so that the demounting described above occurs. For example, pulling or forcing the adhesive film through the blade-edge surface refers also to pushing the blade-edge surface through the adhesive film, or some combination of movements of each item.

As noted above, assembly 500 is preferably oriented so that the substantially parallel, rectangular workpieces 521 are substantially perpendicular to the blade edges 122 of blade-edge surface 121. Thus, they can be supported by blade-edge surface 121. Laser bars can be very thin and comparatively long, e.g. about 15 mm long, with a rectangular cross-section (about.0.3 mm wide and 0.1 mm in height). Thus, were laser bar workpieces 521 to be oriented substantially parallel to blade edges 122, they could fall through and between blades 120 after being, demounted from adhesive film 512, or otherwise be damaged.

Depending on the blade spacing selected, the size and shape of the workpieces to be demounted, and the size of the wafer and adhesive film, a sufficient plurality of blades of the blade array needs to be provided. In an embodiment, for example, a rectangular blade-edge surface such as blade-edge surface 1021 of alternative blade array 1020 of FIG. 10 may be employed (e.g., when substantially oblong, long and thin laser bars are to be demounted), having 20–25 blades, which are razor blades having a rectangular blade-edge surface approximately 2.3 cm wide, with approximately 0.92 mm interblade spacing. This would provide about 16 support points for 15 mm long laser bars.

In another embodiment, the blade spacing may range from 0.5 mm to 2 mm, depending upon the application, adhesive film employed, wafer size, and size of workpieces. For 15 mm-long laser bars, this would provide about 7 to 30 contact points supporting each laser bar workpiece 521 that is perpendicular to the blade edges 122.

After the film 512 has been pulled completely beneath blade-edge surface 121, all of the now-demounted workpieces 521 are resting on blade-edge surface 121. Because they are not adhesively attached to the surface 121 or the film 512, they may be easily picked up and removed from the apparatus 101, for further packaging, processing, or handling. For example, vacuum tweezers do not provide sufficient force to remove workpieces from the adhesive film directly, however, vacuum tweezers may be employed to pick up workpieces off of surface 121 without damaging them. After workpieces 121 are removed from blade-edge surface 121 of apparatus 101, the now-cut film 512 may be removed from between the blades 120. For example, frame 510 may be moved upward, so that film 512 is pulled out of the spaces between blades 120.

Figure 7:
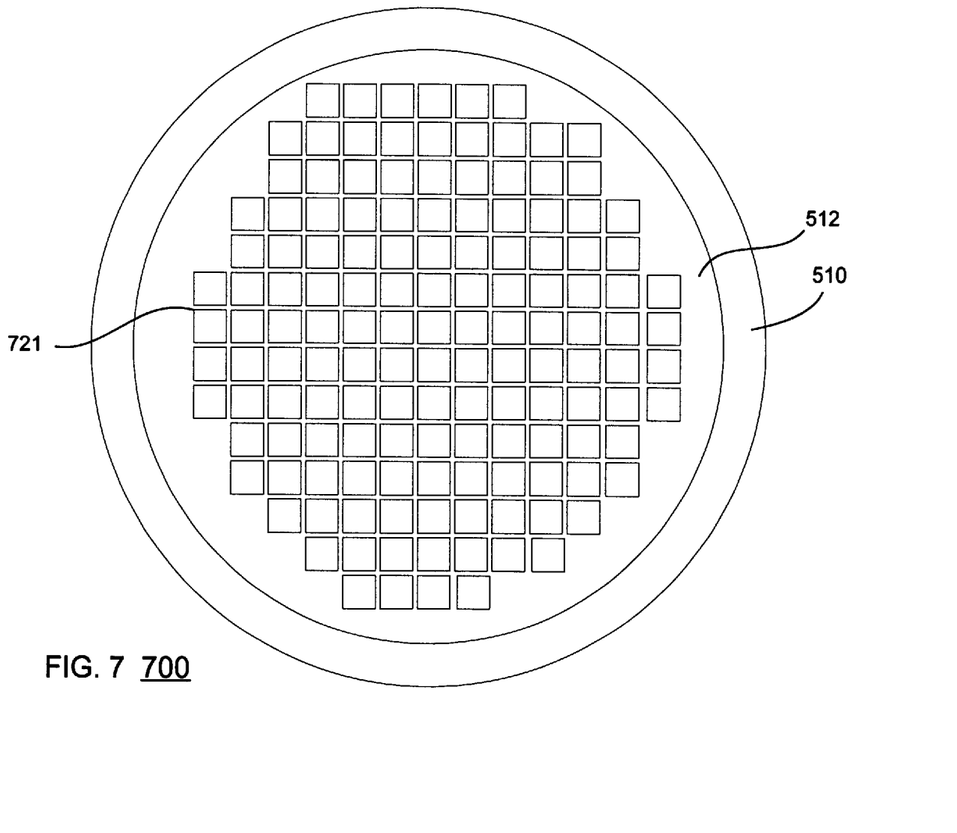
FIG. 7 is a top view of the adhesive film hoop frame of the assembly of FIG. 5 having substantially square semiconductor chip workpieces.

Workpieces other than laser bars may also be demounted from adhesive film in accordance with the present invention. For example, the workpieces may be laser chips other than laser bars, IC semiconductor chips, and other objects and devices. The workpieces may be flat and rectangular or square IC semiconductor chips, for example. Referring now to FIG. 7, there is shown a top view of the adhesive film hoop frame 510 of the assembly of FIG. 5 having substantially square semiconductor chip workpieces 721 adhesively mounted on adhesive film 512. These may be about 5 mm square and about 0.5 mm in thickness, for example, though other sizes are possible. The blade spacing for a given workpiece demounting apparatus 101 should be small enough so that, for a given size and shape workpieces, the workpieces can be supported by the blade-edge surface without being damaged, and large enough so that the adhesive film can be pulled between the blades, beneath the blade-edge surface, after being cut by the blade edges. For a blade spacing ranging from 0.5 mm to 2 mm, for example, there would be about 2 to 10 contact points supporting each 5 mm-square chip.

Figure 8A:
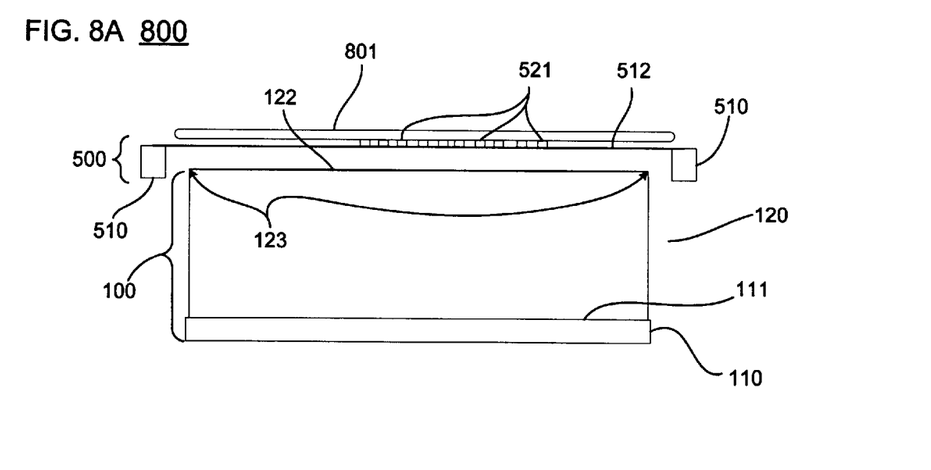
FIGS. 8A–B are cross-sectional side views illustrating an alternative method for removal of the workpieces from the assembly of FIG. 5 using the workpiece demounting apparatus of FIGS. 1–2, in accordance, with an alternative embodiment of the present invention.
Figure 8B:
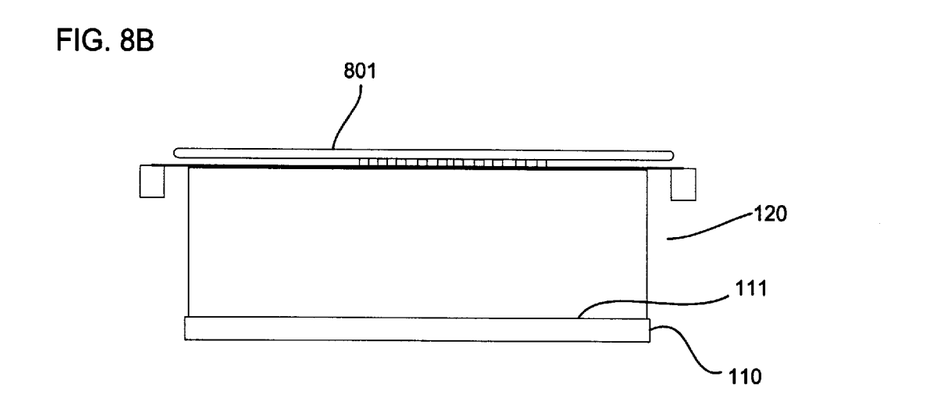
Figure 9:
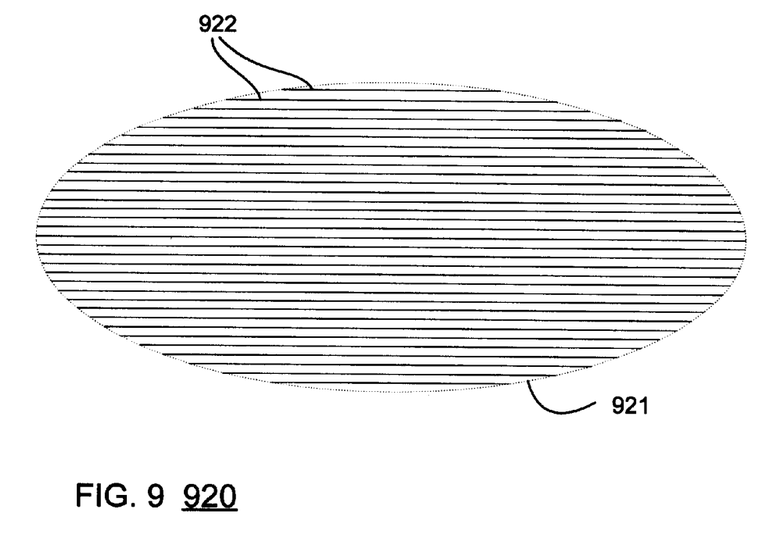
FIG. 9 is a top view of an elliptical blade surface of an alternative workpiece demounting apparatus, in accordance with an alternative embodiment of the present invention.
Figure 10:
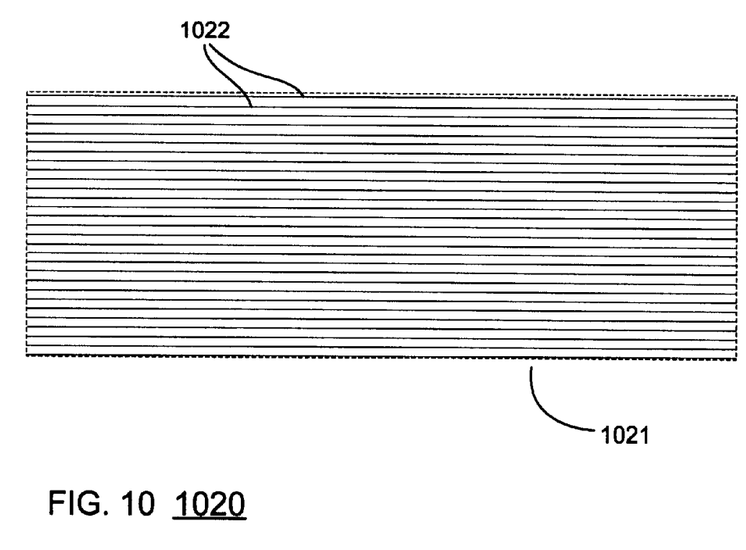
FIG. 10 is a top view of a rectangular blade surface of an alternative workpiece demnounting apparatus, in accordance with an alternative embodiment of the present invention.

Referring now to FIGS. 8A–B, there are shown cross-sectional side views illustrating an alternative method for removal of the workpieces from the assembly of FIG. 5 using the workpiece demounting apparatus of FIG. 1. A soft, nonadhesive support pad or film 801 is disposed above the adhesive surface of adhesive film 512 and covering workpieces 521, so that workpieces 521 are situated between the adhesive film 512 and pad 801. One purpose of pad 801 is to minimize movement or damage to workpieces 521 during the demounting process. For example, in some applications the workpieces could move or "jump" or bounce slightly when the adhesive film is being pulled off of the workpiece. The presence of pad 801 can help prevent such movement or damage, by being gently applied to secure the position of the workpieces during the demounting process, as illustrated in FIGS. 8A–B.

After the workpieces are demounted, the pad may be removed so that the workpieces may be removed. Alternatively, some of the workpieces may "stick" to the pad by static or other forces, and may need to be removed from the pad itself. In another embodiment, after demounting the workpieces from the film, the entire assembly of assembly 500, pad 801, demounted workpieces 521, and apparatus 101 may be flipped over, and the apparatus 101 and frame 510 lifted off of pad 801, leaving the workpieces lying on pad 801, from where they may be removed. In another alternative, the assembly shown in FIGS. 8A–B may be flipped over during the demounting process itself, so that when the workpieces are demounted, they "fall" or rest on pad 801 itself. In this embodiment, the blade-edge surface supports the workpieces during the demounting operation, i.e. it prevents them from being pulled "beneath" the blade-edge surface when the adhesive film is being cut and pulled beneath the surface. As soon as the adhesive film portion under a given workpiece is cut and pulled beneath the blade-edge surface, the workpiece becomes separated from the film and falls to rest on pad 801. Pad 801 in this embodiment functions as a catch surface. In this embodiment, the workpiece demounting apparatus and adhesive film are oriented so that the workpieces fall or slide free from the blade-edge surface onto an appropriate catch surface such as pad 801, as soon as they are pulled free from the adhesive film. As noted above, the relative designations such as top, bottom, upper, lower, up, and down may be applied to such an embodiment even if it is employed "upside down".

Thus, the present invention provides an apparatus and method for demounting small, fragile workpieces, such as semiconductor chips or laser chips or bars, from an adhesive film. The workpiece removal apparatus and method of the present invention does not require the use of expensive films which have degradeable adhesives thereon.

In the present invention, a "non-section-112(6) means" for performing a function refers to any means that performs the function, as opposed to a section 112(6) means (i.e., "means-for" elements under 35 U.S.C. section 112, paragraph 6), which literally cover only the corresponding stucture, material, or acts described in the specification and equivalents thereof, which support the means-for element.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all if respects.

What is claimed is:

1. A method for demounting workpieces attached to an adhesive surface of an adhesive film, the adhesive film having a bottom surface, the method comprising the steps of:

(a) providing a workpiece demounting apparatus comprising a plurality of substantially parallel blades, wherein: each of the blades has a substantially linear blade edge; each blade edge lies within a blade-edge plane that is substantially perpendicular to the blades; and the spacing between the blades is small enough to support said workpieces, whereby the plurality of blade edges provides a substantially planar blade-edge surface (b) moving the bottom surface of the adhesive film into contact with the blade-edge surface;

(c) forcing the adhesive film through the blade-edge surface so that the blade edges cut the adhesive film and support the workpieces while the adhesive film is pulled free from the workpieces.

2. The method of claim 1, further comprising the step, before step (c), of orienting the blade-edge surface relative to the direction of the blade edges of the blade-edge surface, so that the demounted workpieces remain free standing on the blade-edge surface following step (c).

3. The method of claim 1, further comprising the step, before or during step (c), of orienting the workpiece demounting apparatus and adhesive film so that the workpieces fall or slide free from the blade-edge surface onto an appropriate catch surface.

4. The method of claim 1, further comprising the step of disposing a soft support pad over the workpieces during at least step (c) to minimize damage to said workpieces during said step.

5. The method of claim 1, further comprising the step of removing the workpieces from the blade-edge surface after step (c).

6. The method of claim 1, wherein the workpiece demounting apparatus further comprises a base having a bottom surface and a top surface, wherein the plurality of blades are mounted at the first end of each blade to the top surface of the base.

7. The method of claim 6, wherein the adhesive film is supported by an adhesive film frame having an inner dimension larger than the blade-edge surface, the workpiece demounting apparatus further comprising a guideframe base for supporting said base, an adhesive film frame holding member for holding the adhesive film frame, and a plurality of linear guides coupled to said guideframe base and slideably engaged to said holding member so that the adhesive film is substantially parallel to the blade-edge surface, the method further comprising the steps of:

before step (b), mounting the adhesive film frame to the adhesive film frame holding member so that the bottom surface of the adhesive film is above and facing the blade-edge surface;

wherein step (b) comprises the step of sliding the adhesive film frame holding member down said linear guides towards the blade-edge surface; and wherein step (c) comprises the step of said sliding the adhesive film frame holding member down said linear guides, below the blade-edge surface.

8. The method of claim 1, wherein the bottom surface of the base is substantially parallel to the blade-edge surface.

9. The method of claim 1, wherein the blade-edge surface is substantially circular and the adhesive film is supported by a substantially circular hoop frame having an inner diameter greater than the diameter of the circular blade-edge surface.

10. The method of claim 1, wherein the blades are substantially evenly spaced apart.

11. The method of claim 1, wherein the workpieces are rectangular semiconductor laser bars having a length of about 15 mm and the maximum blade spacing in said plurality of blades is about 2 mm.

12. The method of claim 1, wherein the blades are substantially evenly spaced apart and the blade spacing between adjacent blades is about 0.5 mm to 2 mm.

13. The method of claim 1, wherein step (c) comprises the step keeping the adhesive film frame substantially parallel to the blade-edge surface during step (c).

14. The method of claim 1, wherein step (c) comprises employing additional adhesive film moving members to help force the adhesive film down through the blade array.

15. The method of claim 14, wherein the additional adhesive film moving members are positioned closer to the blades than is the adhesive film frame.

16. The method of claim 14, wherein the additional adhesive film moving members comprise a plurality of fingers, wherein step (c) comprises the step of inserting the fingers between said blades and above the adhesive film and pushing down on the adhesive film.

* * * * *